United States Patent
Liang et al.

(10) Patent No.: US 9,275,967 B2
(45) Date of Patent: Mar. 1, 2016

(54) PROTRUSION BUMP PADS FOR BOND-ON-TRACE PROCESSING

(71) Applicant: Taiwan Semiconductor Manufacturing Company, Ltd., Hsin-Chu (TW)

(72) Inventors: Yu-Min Liang, Zhongli (TW); Jiun-Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 84 days.

(21) Appl. No.: 14/148,482

(22) Filed: Jan. 6, 2014

(65) Prior Publication Data

US 2015/0194404 A1    Jul. 9, 2015

(51) Int. Cl.
*H01L 23/00* (2006.01)
*H01L 23/48* (2006.01)
*H01L 21/66* (2006.01)

(52) U.S. Cl.
CPC ............... *H01L 24/17* (2013.01); *H01L 22/14* (2013.01); *H01L 23/481* (2013.01); *H01L 24/11* (2013.01); *H01L 24/81* (2013.01); *H01L 24/02* (2013.01); *H01L 2224/11614* (2013.01); *H01L 2224/11622* (2013.01); *H01L 2224/16225* (2013.01); *H01L 2224/16227* (2013.01); *H01L 2224/16235* (2013.01); *H01L 2224/17132* (2013.01); *H01L 2224/81815* (2013.01); *H01L 2924/14* (2013.01); *H01L 2924/2064* (2013.01); *H01L 2924/20641* (2013.01)

(58) Field of Classification Search
CPC ..... H01L 23/481; H01L 23/485; H01L 24/02; H01L 24/25; H01L 24/09; H01L 24/10; H01L 24/17; H01L 2224/8019; H01L 2224/8034; H01L 2224/81; H01L 2224/8119; H01L 2224/8319
See application file for complete search history.

(56) References Cited

U.S. PATENT DOCUMENTS

| | | | | |
|---|---|---|---|---|
| 5,892,277 | A * | 4/1999 | Ikemizu | H01L 23/49572 257/700 |
| 6,087,251 | A * | 7/2000 | Hsu | H01L 21/76807 257/E21.579 |
| 6,348,398 | B1 * | 2/2002 | Wang | H01L 21/76802 257/E21.577 |
| 6,352,916 | B1 * | 3/2002 | Tang | H01L 21/76801 257/E21.576 |
| 6,388,322 | B1 | 5/2002 | Goossen et al. | |
| 6,465,886 | B1 * | 10/2002 | Horiuchi | H01L 24/10 257/738 |
| 6,627,824 | B1 | 9/2003 | Lin | |

(Continued)

*Primary Examiner* — David Zarneke
(74) *Attorney, Agent, or Firm* — Slater & Matsil, L.L.P.

(57) ABSTRACT

A die and a substrate are provided. The die comprises at least one integrated circuit chip, and the substrate comprises first and second subsets of conductive pillars extending at least partially therethrough. Each of the first subset of conductive pillars comprises a protrusion bump pad protruding from a surface of the substrate, and the second subset of conductive pillars each partially form a trace recessed within the surface of the substrate. The die is coupled to the substrate via a plurality of conductive bumps each extending between one of the protrusion bump pads and the die.

20 Claims, 5 Drawing Sheets

(56) References Cited

U.S. PATENT DOCUMENTS

| | | | |
|---|---|---|---|
| 6,797,615 B1* | 9/2004 | Lous | H01L 21/76819 257/E21.58 |
| 7,112,524 B2* | 9/2006 | Hsu | H01L 24/11 257/E21.508 |
| 8,318,537 B2* | 11/2012 | Pendse | H01L 21/563 257/778 |
| 8,952,538 B2* | 2/2015 | Matsuki | H01L 24/03 257/701 |
| 2002/0048944 A1* | 4/2002 | Tang | H01L 21/76801 438/672 |
| 2002/0187585 A1* | 12/2002 | Tsukada | H01L 24/11 438/106 |
| 2009/0121349 A1* | 5/2009 | Suzuki | H01L 21/76819 257/737 |
| 2011/0133334 A1* | 6/2011 | Pendse | H01L 21/563 257/737 |
| 2011/0217842 A1* | 9/2011 | Park | H01L 21/283 438/674 |
| 2012/0098120 A1 | 4/2012 | Yu et al. | |
| 2012/0175774 A1* | 7/2012 | West | H01L 23/3128 257/751 |
| 2014/0035095 A1* | 2/2014 | Lin | H01L 21/48 257/528 |
| 2014/0151867 A1* | 6/2014 | Lin | H01L 28/00 257/676 |

* cited by examiner

PROTRUSION BUMP PADS FOR BOND-ON-TRACE PROCESSING

BACKGROUND

In Bond-on-Trace (BoT) processing, a singulated, integrated circuit (IC) chip is flipped and connected to bond pad portions of traces formed on another substrate. A subset of the traces, also known as skip lines, includes traces extending between the bond pad portions, such as for fan-out purposes. Thus, the trace pitch is less than the bond pad pitch. However, this resulted in solder bonds inadvertently bridging connections with adjacent traces, and made probe testing overly challenging as the trace pitch fell below the diameter of common testing probes.

SUMMARY OF THE INVENTION

The present disclosure introduces a method comprising separating a substrate from a carrier on which an additional substrate is formed. The separated substrate comprises a conductive layer on a top surface of the substrate and a plurality of conductive pillars each extending from a bottom surface of the substrate and through the substrate to the conductive layer. A protrusion bump pad is formed over each of a first subset of the conductive pillars by selectively removing the conductive layer except from over each of the first subset of conductive pillars.

The present disclosure also introduces an apparatus comprising a substrate and a plurality of conductive traces on a first side of the substrate. Conductive pillars extend through the substrate from a second side of the substrate to corresponding ones of the conductive traces. Bump pads protrude from a first subset of the conductive traces, whereas each of a second subset of the conductive traces is recessed within the first side of the substrate.

The present disclosure also introduces a method comprising providing a die and a substrate, wherein the die comprises at least one integrated circuit chip, and the substrate comprises first and second subsets of conductive pillars extending therethrough. Each of the first subset of conductive pillars comprises a protrusion bump pad protruding from a surface of the substrate, and the second subset of conductive pillars each partially form a trace recessed within the surface of the substrate. The die is then coupled to the substrate via a plurality of conductive bumps each extending between one of the protrusion bump pads and the die.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
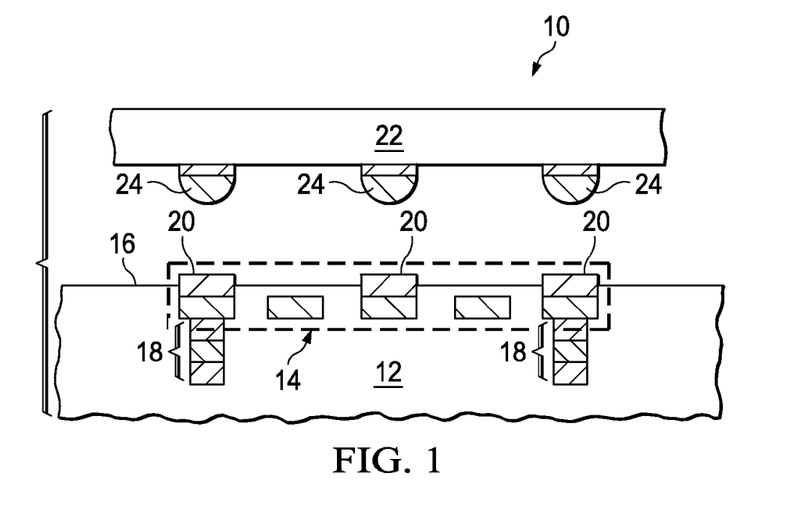
FIG. 1 is a sectional view of at least a portion of apparatus according to one or more aspects of the present disclosure.

FIG. 1 is a sectional view of at least a portion of an apparatus 10 in an intermediate stage of manufacture according to one or more aspects of the present disclosure. The apparatus 10 comprises a substrate 12 and a plurality of conductive traces 14 disposed on a side 16 of the substrate. Conductive members 18 may extend into the substrate 12 from corresponding ones of the conductive traces 14. Bump pads 20 each protrude from one of a first subset of the conductive traces 14. Each of a second subset of the conductive traces 14 is recessed within the side 16 of the substrate 12. The apparatus 10 may further comprise an integrated circuit chip 22 and a plurality of conductive bumps 24 coupled between the integrated circuit chip and corresponding ones of the bump pads 20.

Figure 2:
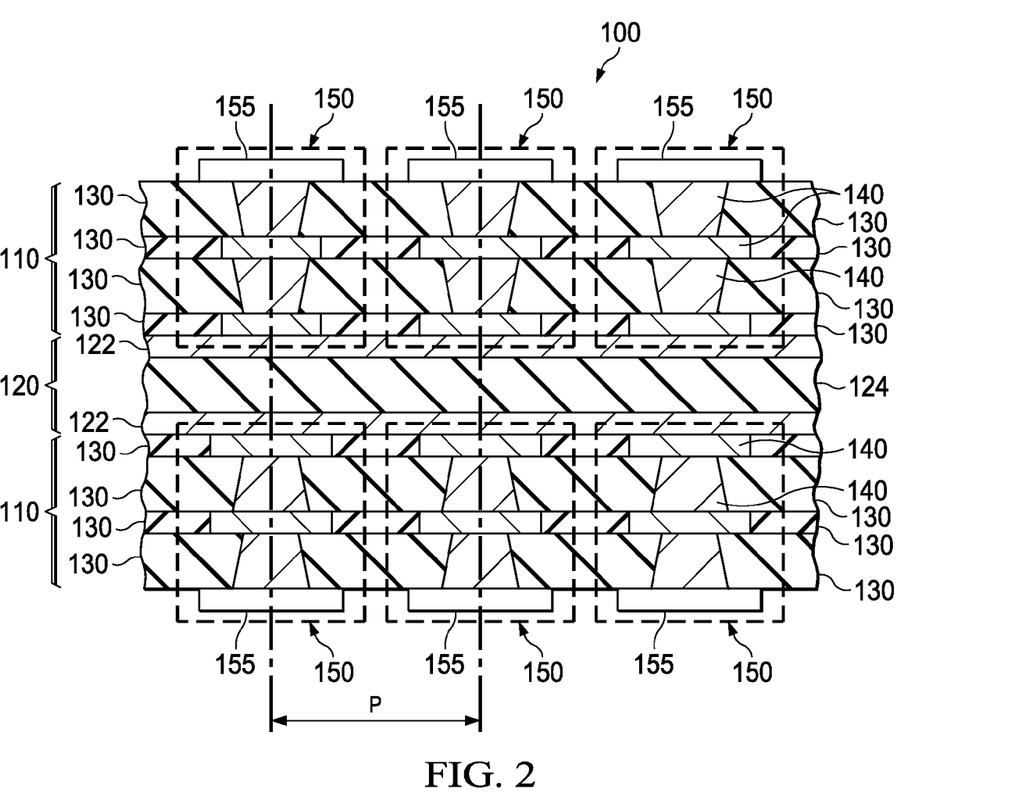
FIG. 2 is a sectional view of at least a portion of apparatus in an intermediate stage of manufacture according to one or more aspects of the present disclosure.

FIG. 2 is a sectional view of an implementation of the apparatus 10 shown in FIG. 1, herein designated by the reference numeral 100. The apparatus 100 is depicted in FIG. 2 as being in an intermediate stage of manufacture according to one or more aspects of the present disclosure. The apparatus 100 comprises build-up layers 110 on opposing sides of a carrier substrate 120. The carrier substrate 120 may comprise a coreless substrate, such as may comprise one or more metal layers 122 formed on one or both sides of an insulation layer 124. The insulation layer 124 and/or the carrier substrate 120 may comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The one or more metal layers 122 may comprise one or more layers of copper, nickel, aluminum, and/or other materials.

Among other components, the build-up layers 110 may comprise multiple dielectric layers 130 and metallization layers 140. Portions of the metallization layers 140 are vertically aligned to form conductive pillars 150.

The dielectric layers 130 may comprise a prepreg or ajinomoto build-up film (ABF). Alternatively, or additionally, the dielectric layers 130 may comprise paper, glass fiber, and/ non-woven glass fabric, one or more of which may be applied by lamination. Alternatively, or additionally, the dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric layers 130 may be formed by sputtering, spin-on coating, chemical vapor deposition (CVD), low-pressure CVD, rapid thermal CVD, atomic layer CVD, and/or plasma enhanced CVD, perhaps utilizing tetra-ethyl orthosilicate and oxygen as a precursor. The dielectric layers 130 may also be formed by an oxidation process, such as wet or dry thermal oxidation in an ambient environment comprising an oxide, water, nitric oxide, or a combination thereof, and/or other processes. Fabrication of the dielectric layers 130 may also comprise chemical-mechanical polishing or planarizing (hereafter collectively referred to as CMP), isotropic etching, and/or anisotropic etching, among other processes. The dielectric layers 130 may be formed to a thickness ranging between about eight angstroms and about 200 angstroms, although other thicknesses are also within the scope of the present disclosure.

The metallization layers 140 may comprise one or more of copper, titanium, aluminum, nickel, gold, alloys and/or combinations thereof, and/or other materials. The metallization layers 140 may be formed by plating, perhaps to a thickness ranging between about four microns and about 25 microns. Alternatively, or additionally, the metallization layers 140 may be formed by CVD and/or other processes, and may have a thickness ranging between about eight angstroms and about 200 angstroms, although other thicknesses are also within the scope of the present disclosure.

The conductive pillars 150 and/or bond pads 155 thereof may have diameter and/or other lateral dimension ranging between about 150 microns and about 400 microns. The bond pads 155 may each be a BGA (ball grid array) pad, such as may be subsequently utilized in forming an interconnection with a "mother board" PCB (printed circuit board) and/or another PCB, PWB (printed wiring board), PCA (printed circuit assembly), PCBA (PCB assembly), CCA (circuit card assembly), backplane assembly, and/or apparatus. A pillar pitch P, or the lateral offset between neighboring conductive pillars 150 and/or bond pads 155, may range between about 300 microns and about 500 microns.

Figure 3:
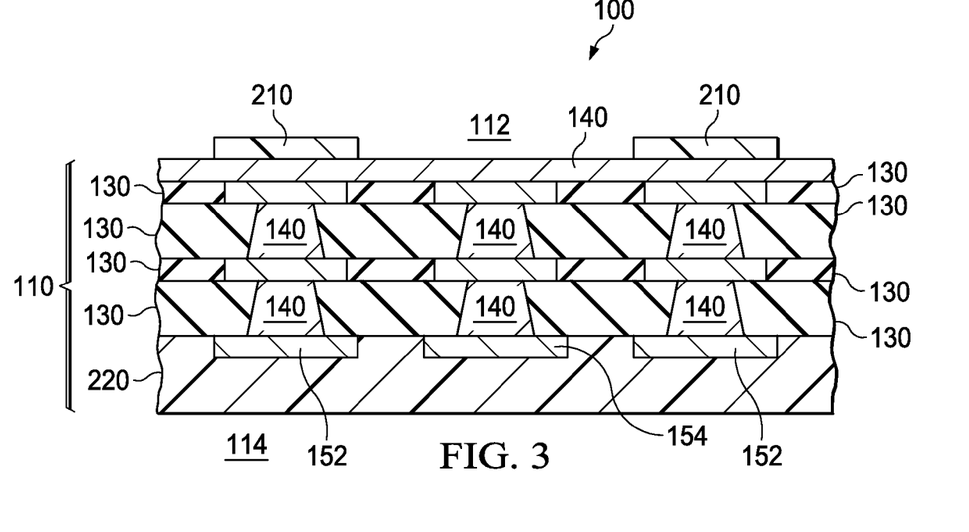
FIG. 3 is a sectional view of the apparatus shown in FIG. 2 in a subsequent stage of manufacture according to one or more aspects of the present disclosure.

FIG. 3 is a sectional view of the apparatus 100 shown in FIG. 2 in a subsequent stage of manufacture according to one or more aspects of the present disclosure, in which the sections of build-up layers 110 have been removed from the carrier substrate 120. One of the sections of build-up layers 110 is not shown in FIG. 3, although this is merely for the sake of simplifying the following discussion, and a person having ordinary skill in the art will readily recognize that both sections of the build-up layers 110 may be processed according to one or more of the aspects of the present disclosure. The build-up layers 110 may be removed from the carrier substrate 120 by routing, melting, mechanical force, etching and/or other processes.

A photoresist layer may then be coated, exposed, and developed on one or both sides of the build-up layers 110. For example, photoresist portions 210 may be formed on a first side 112 of the build-up layers 110, and a photoresist layer 220 may substantially cover a second side 114 of the build-up layers 110. The conductive pillars 150 may be divided between a first subset and a second subset. In FIG. 3, the first subset comprises conductive pillars 152, and the second subset comprises conductive pillar 154. The first subset will comprise more than the two conductive pillars 152 depicted in FIG. 3, and the second subset will comprise more than the one conductive pillar 154 depicted in FIG. 3.

The photoresist portions 210 on the first side 112 of the build-up layers 110 are formed over each conductive pillar 152 of the first subset, whereas the conductive pillars 154 of the second subset and the remaining surface features on the first side 112 of the build-up layers 110 may remain exposed to the subsequent lithographic processing. The photoresist portions 210 and layer 220 may comprise a chemically amplified photoresist or a non-chemically amplified photoresists, and may be positive-tone or negative tone. Processing of the photoresist portions 210 and layer 220 may comprise a deposition process including, for example, lamination of a dry film type photoresist, spin-on-coating, dip coating, brush coating, and/or ink-jet dispensing, among others. A post deposition baking step may be performed to remove solvent and/or other unwanted components, such as to a temperature ranging between about 40° C. and about 200° C., perhaps for a baking time ranging between about 10 seconds and about 10 minutes.

Figure 4:
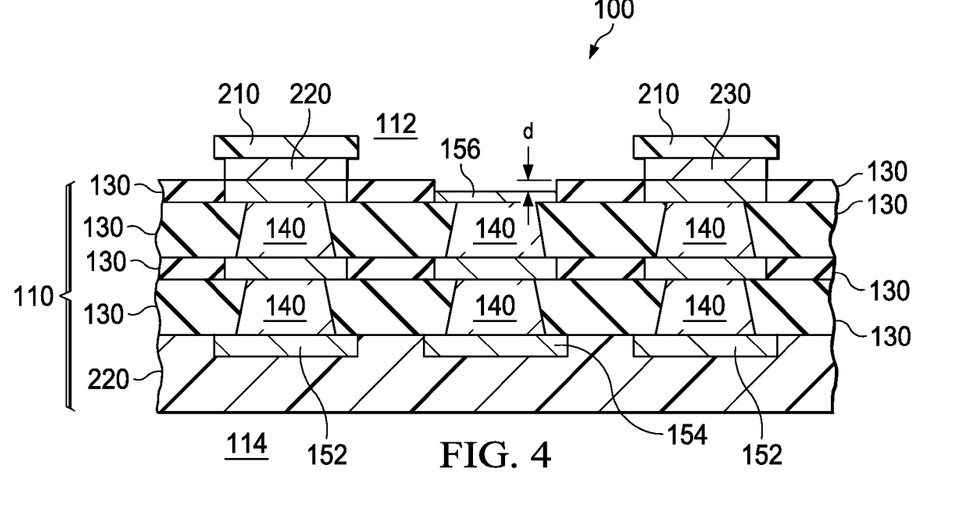
FIG. 4 is a sectional view of the apparatus shown in FIG. 3 in a subsequent stage of manufacture according to one or more aspects of the present disclosure.

FIG. 4 is a sectional view of the apparatus 100 shown in FIG. 3 in a subsequent stage of manufacture according to one or more aspects of the present disclosure, in which the photoresist portions 210 over the conductive pillars 152 of the first subset have been utilized as a mask during an etching process. The etching process is utilized to remove the portions of the outermost metallization layers 140 that are not protected by the photoresist portions 210 and layer 220. Thus, on the first side 112 of the build-up layers 110, the outermost metallization layer 140 is removed down to the outermost dielectric layer 130. However, the etching of the outermost metallization layer 140 over the conductive pillars 154 of the second subset is continued for a sufficient time so as to recess the exposed surface 156 of the conductive pillars 154 within the outer surface of the outermost dielectric layer 130. The exposed surface 156 of the second subset of conductive pillars 154 thus forms a portion of a recessed trace, whereas the masked portion of each of the first subset of conductive pillars 152 forms a protrusion bump pad 230. The depth d of the recess over the recessed trace, below the surface of the surrounding dielectric layer 130, may be less than about seven microns, such as about four microns, although other depths are also within the scope of the present disclosure.

Figure 5:
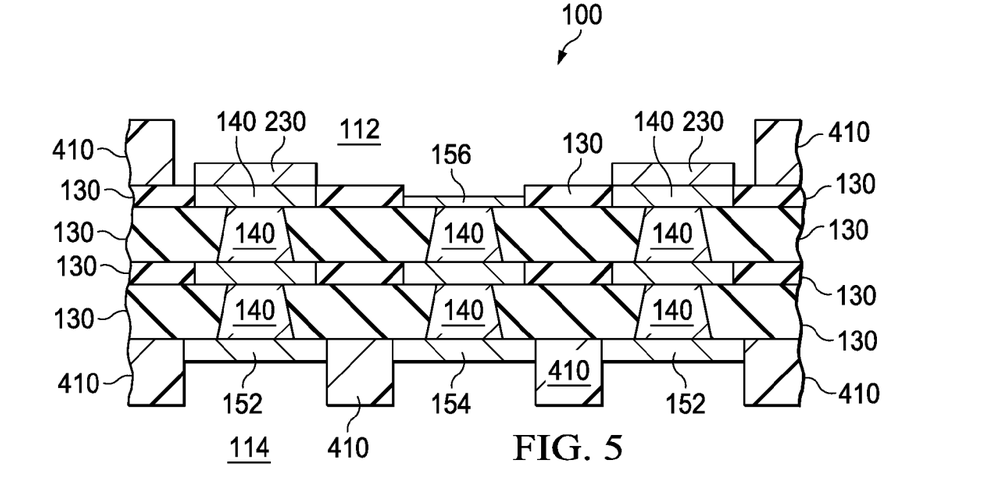
FIG. 5 is a sectional view of the apparatus shown in FIG. 4 in a subsequent stage of manufacture according to one or more aspects of the present disclosure.

FIG. 5 is a sectional view of the apparatus 100 shown in FIG. 4 in a subsequent stage of manufacture according to one or more aspects of the present disclosure, in which the photoresist portions 210 and the photoresist layer 220 have been removed, and solder resist portions 410 have been formed by conventional means. The solder resist portions 410 may comprise a heat-resistant coating material, and may aid in protecting the underlying layers.

Figure 6:
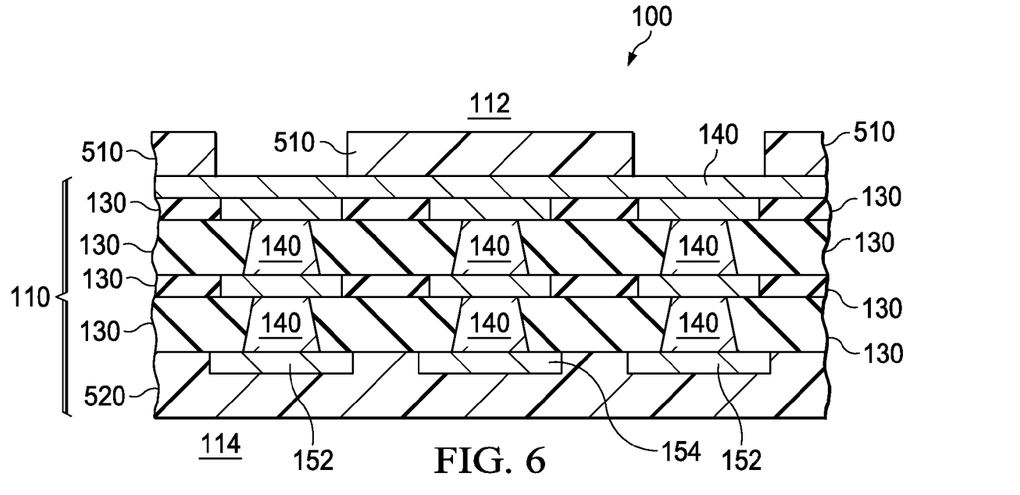
FIG. 6 is a sectional view of the apparatus shown in FIG. 2 in a subsequent stage of manufacture according to one or more aspects of the present disclosure.
Figure 7:
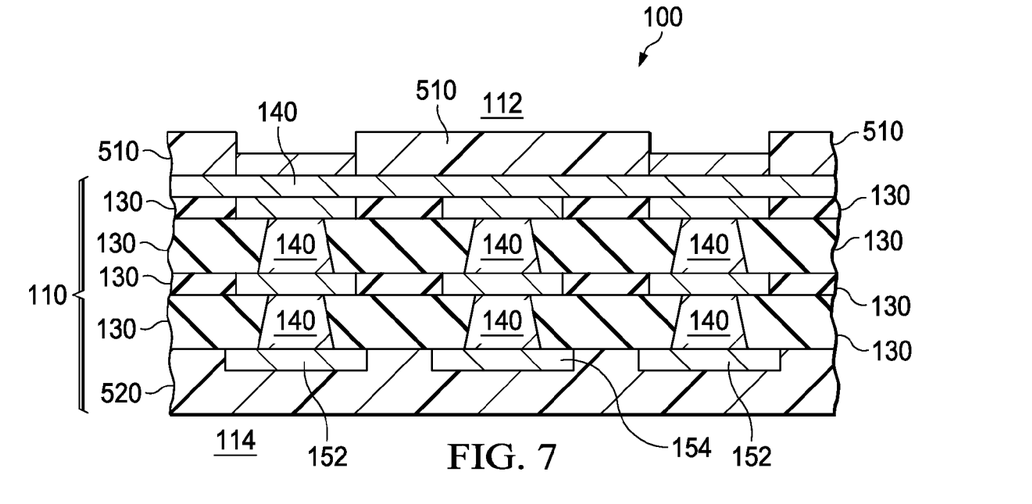
FIG. 7 is a sectional view of the apparatus shown in FIG. 6 in a subsequent stage of manufacture according to one or more aspects of the present disclosure.
Figure 8:
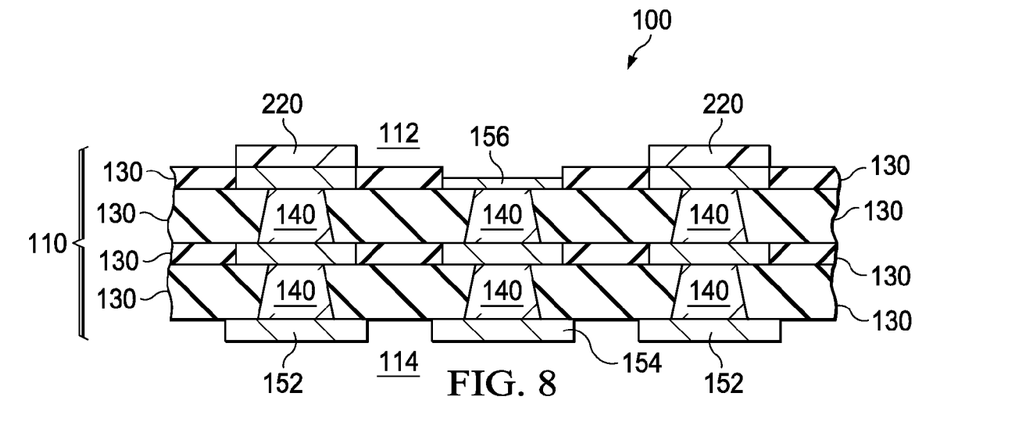
FIG. 8 is a sectional view of the apparatus shown in FIG. 7 in a subsequent stage of manufacture according to one or more aspects of the present disclosure.

Other methods of forming the protrusion bump pads 230 and recessed traces 156 are also within the scope of the present disclosure. One such example is depicted in FIGS. 6-8. FIG. 6 is a sectional view of the apparatus 100 shown in FIG. 2 in a subsequent stage of manufacture according to one or more aspects of the present disclosure. As above, the build-up layers 110 have been removed from the carrier substrate 120. A photoresist layer may then be coated, exposed, and developed on one or both sides of the build-up layers 110. For example, photoresist portions 510 may be formed on the first side 112 of the build-up layers 110, and a photoresist layer 520 may substantially cover the second side 114 of the build-up layers 110. The photoresist portions 510 on the first side 112 of the build-up layers 110 may substantially cover the entire first side 112, including over each conductive pillar 154 of the second subset, except for over the conductive pillars 152 of the first subset, which remain exposed for subsequent processing.

FIG. 7 is a sectional view of the apparatus 100 shown in FIG. 6 in a subsequent stage of manufacture according to one or more aspects of the present disclosure, in which the photoresist portions 510 have been utilized as a mask during a metallization process. The metallization process is utilized to add metal to the exposed conductive pillars 152 of the first subset. The material added by the metallization process may comprise one or more of copper, titanium, aluminum, nickel, gold, alloys and/or combinations thereof, and/or other materials. The metallization may be formed by electroplating, electroless plating, CVD, epitaxial growth, and/or other processes, and may add material to the conductive pillars 152 to a thickness ranging between about five microns and about 50 microns, although other thicknesses are also within the scope of the present.

FIG. 8 is a sectional view of the apparatus 100 shown in FIG. 7 in a subsequent stage of manufacture according to one or more aspects of the present disclosure, in which the photoresist portions 510 and the photoresist layer 520 have been removed. FIG. 8 also reflects the result of an etching process selective to the conductive pillars 152 of the first subset, the conductive pillars 154 of the second subset, and the outermost metallization layer 140. For example, the outermost metallization layer 140 is removed down to the outermost dielectric layer 130, including to a degree sufficient to recess the exposed surface 156 of the second subset of conductive pillars 154 within the outer surface of the outermost dielectric layer 130. As above, the exposed surface 156 of the second subset of conductive pillars 154 forms a portion of a recessed trace, whereas the now protruding portion of each of the first subset of conductive pillars 152 forms a protrusion bump pad 230. The tops of the conductive pillars (the protruding pillars) are also etched back during this process. Therefore, the process step of adding metallization, illustrated in FIG. 7, should be adjusted to ensure that sufficient height of the protruding pillars remains, even after this subsequent etch step. Additional processing may ensue, such as to form solder resist portions and/or otherwise arrive at the embodiment depicted in FIG. 5.

Figure 9:
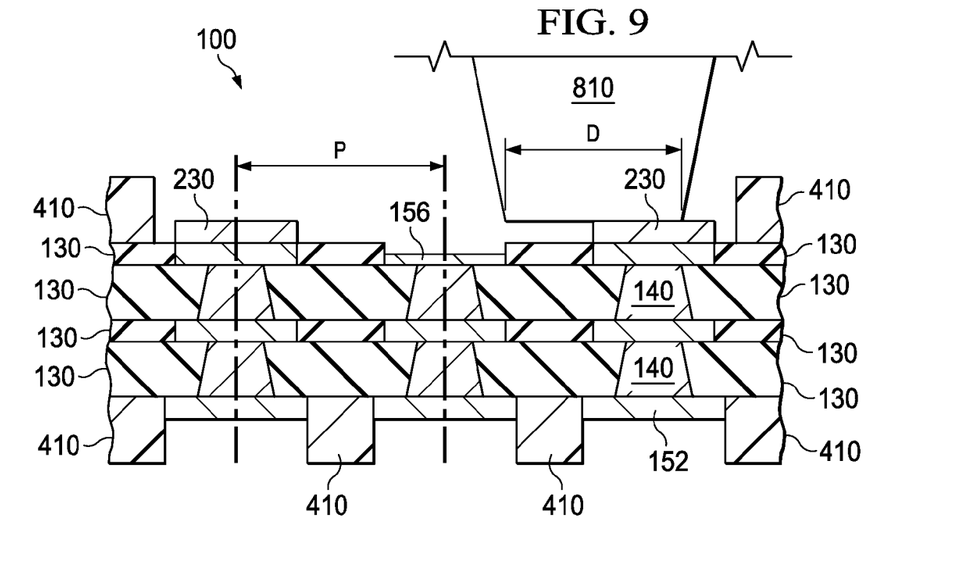
FIG. 9 is a sectional view of the apparatus shown in FIG. 5 in a subsequent stage of manufacture according to one or more aspects of the present disclosure.

FIG. 9 is a sectional view of the apparatus 100 shown in FIG. 5 in which a testing probe 810 has been brought into contact with one of the protrusion bump pads 230 of a conductive pillar 152 of the first subset. The tip of the testing probe 810 may have a diameter D, which may be substantially greater than the pillar pitch P. For example, the pillar pitch P may be about 40 microns, if not smaller, and the testing probe 810 may have a tip diameter D of about 30 microns, if not significantly larger. However, because the conductive pillars 154 of the second subset are recessed, they are not shorted by misalignment of the testing probe 810 relative to the conductive pillars 152 of the first subset.

Figure 10:
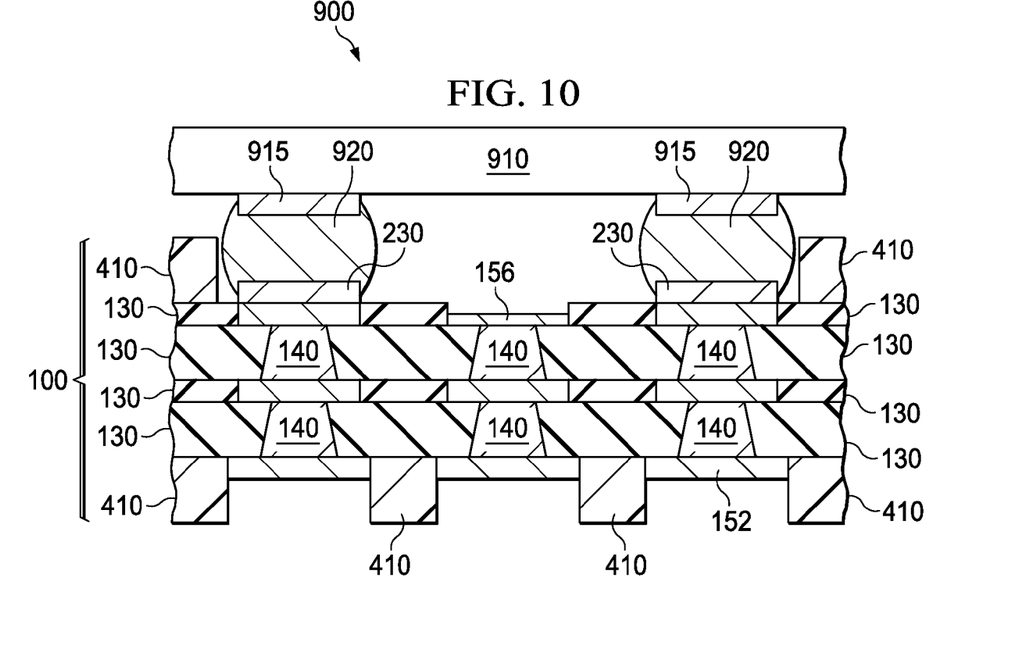
FIG. 10 is a sectional view of the apparatus shown in FIG. 5 in a subsequent stage of manufacture according to one or more aspects of the present disclosure.

FIG. 10 is a sectional view of at least a portion of an apparatus 900 according to one or more aspects of the present disclosure. The apparatus 900 includes the apparatus 100 shown in FIG. 5, a die 910, and a plurality of conductive bumps 920 coupled between the integrated circuit chip and corresponding ones of the bump pads. The die 910 may be or comprise one or more integrated circuit chips, packages, and the like. The conductive bumps 920 may comprise solder, gold, conductive paste, and/or other electrically conductive materials. The die 910 may comprise pads 915 configured to be aligned with the protrusion bump pads 230 prior to be coupled by the conductive bumps 920.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
   separating a substrate from a carrier on which an additional substrate is formed, wherein the separated substrate comprises a conductive layer on a top surface of the substrate and a plurality of conductive pillars each extending from a bottom surface of the substrate and through the substrate to the conductive layer; and
   forming a protrusion bump pad over each of a first subset of the conductive pillars by selectively removing the conductive layer except from over each of the first subset of conductive pillars.

2. The method of claim 1 wherein forming the protrusion bump pad over each of the first subset of the conductive pillars comprises:
   forming a photoresist mask on the conductive layer over each of the first subset of conductive pillars but not over the remaining conductive pillars; and
   etching to remove the conductive layer except from underneath the photoresist masks.

3. The method of claim 2 wherein forming the photoresist mask on the conductive layer over each of the first subset of conductive pillars but not over the remaining conductive pillars comprises forming the photoresist mask on the conductive layer over each of the first subset of conductive pillars but not over the remaining portions of the conductive layer.

4. The method of claim 2 wherein forming the photoresist mask on the conductive layer over each of the first subset of conductive pillars but not over the remaining conductive pillars comprises forming the photoresist mask on the conductive layer only over each of the first subset of conductive pillars.

5. The method of claim 2 wherein etching to remove the conductive layer removes a sufficient portion of the conductive layer from over each of the conductive pillars that are not part of the first subset to expose a conductive surface recessed within the top surface of the substrate.

6. The method of claim 5 wherein a portion of the conductive layer that was thinned by the etching comprises the conductive surface.

7. The method of claim 5 wherein the conductive surface is that of a corresponding one of the conductive pillars that are not part of the first subset.

8. The method of claim 1 wherein forming the protrusion bump pad over each of the first subset of the conductive pillars comprises:
    forming a photoresist mask on the conductive layer over each conductive pillar not in the first subset but not over the conductive pillars in the first subset;
    adding additional conductive material to the portions of the conductive layer not covered by the photoresist masks;
    removing the photoresist masks; and
    etching to remove a sufficient portion of the conductive layer from over each of the conductive pillars that are not part of the first subset to expose a conductive surface recessed within the top surface of the substrate.

9. The method of claim 8 wherein a portion of the conductive layer that was thinned by the etching comprises the conductive surface.

10. The method of claim 8 wherein the conductive surface is that of a corresponding one of the conductive pillars that are not part of the first subset.

11. The method of claim 1 further comprising coupling the substrate with a semiconductor die package by reflowing solder bumps contacting the protrusion bump pad over each of the first subset of conductive pillars.

12. The method of claim 1 further comprising contacting one of the protrusion bump pads with a testing probe.

13. A method, comprising:
    forming on a carrier a substrate comprising first and second subsets of conductive pillars extending therethrough, wherein the first subset of conductive pillars which each comprise a protrusion bump pad protruding from a surface of the substrate, and wherein the second subset of conductive pillars each partially form a trace recessed within the surface of the substrate;
    separating the substrate from the carrier;
    providing a die comprising at least one integrated circuit chip; and
    coupling the die to the substrate via a plurality of conductive bumps each extending between one of the protrusion bump pads and the die.

14. The method of claim 13 wherein the substrate is formed on a first side of the carrier and further comprising:
    forming on a second side of the carrier a second substrate comprising third and fourth subsets of conductive pillars extending therethrough, wherein the third subset of conductive pillars which each comprise a protrusion bump pad protruding from a surface of the substrate, and wherein the fourth subset of conductive pillars each partially form a trace recessed within the surface of the substrate;
    separating the second substrate from the carrier; and
    coupling the second substrate to a second die via a second plurality of conductive bumps each extending between one of the protrusion bump pads of the third plurality and the die.

15. The method of claim 13 wherein the die is coupled to the substrate after the substrate is separated from the carrier.

16. A method comprising:
    forming on a first side of a carrier a plurality of build-up layers, the build-up layers including stacked conductors forming a plurality of conductive pillars extending from a bottom surface of the build-up layers to a top surface of the build-up layers, the conductive pillars being embedded within stacked dielectric layers, wherein respective top surfaces of the respective conductive pillars extend above a top surface of a topmost dielectric layer of the stacked dielectric layers;
    removing the build-up layers from the carrier;
    recessing a first subset of the conductive pillars to have respective top surfaces below the top surface of the topmost dielectric layer while leaving a second subset of the conductive pillars having respective top surfaces extending above the top surface of the topmost dielectric layer; and
    mounting an integrated circuit die to the second subset of the conductive pillars.

17. The method of claim 16 further comprising:
    forming on a second side of a carrier a second plurality of build-up layers, the second build-up layers including stacked conductors forming a second plurality of conductive pillars extending from a bottom surface of the second build-up layers to a top surface of the second build-up layers, the second conductive pillars being embedded within stacked second dielectric layers, wherein respective top surfaces of the respective second conductive pillars extend above a top surface of a second topmost dielectric layer of the stacked second dielectric layers;
    removing the second build-up layers from the carrier;
    recessing a third subset of the second conductive pillars to have respective top surfaces below the top surface of the second topmost dielectric layer while leaving a fourth subset of the second conductive pillars having respective top surfaces extending above the top surface of the second topmost dielectric layer; and
    mounting an integrated circuit die to the fourth subset of the second conductive pillars.

18. The method of claim 16 further comprising depositing additional conductive material on the second subset of the conductive pillars.

19. The method of claim 16 wherein the step of recessing a first subset of the conductive pillars comprises etching back the first subset of the conductive pillars while the second subset of the conductive pillars are covered.

20. The method of claim 16 wherein the step of mounting an integrated circuit die to the second subset of the conductive pillars comprises bonding the integrated circuit die to the second subset of the conductive pillars with solder.

* * * * *